(12) United States Patent
Park et al.

(10) Patent No.: US 10,720,480 B2
(45) Date of Patent: Jul. 21, 2020

(54) DISPLAY DEVICE HAVING AN EMITTING AREA AND A REFLECTING AREA

(71) Applicant: LG Display Co., Ltd., Seoul (KR)

(72) Inventors: ChooJin Park, Seoul (KR); Hye-Sook Kim, Seoul (KR); Moon-Bae Gee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 66 days.

(21) Appl. No.: 15/793,788

(22) Filed: Oct. 25, 2017

(65) Prior Publication Data

US 2018/0114821 A1 Apr. 26, 2018

(30) Foreign Application Priority Data

Oct. 26, 2016 (KR) .......................... 10-2016-0139992

(51) Int. Cl.
*G02B 26/00* (2006.01)
*G02B 26/08* (2006.01)
(Continued)

(52) U.S. Cl.
CPC ........ *H01L 27/3248* (2013.01); *G02F 1/0063* (2013.01); *G02F 2203/02* (2013.01); *G02F 2203/22* (2013.01)

(58) Field of Classification Search
CPC ............. G02B 26/0841; G02B 6/4246; G02B 27/0172; G02B 5/0808; G02B 2027/0123; G02B 2027/015; G02B 26/008; G02B 27/141; G02B 5/3083; G02B 6/4214; G02B 1/10; G02B 1/105; G02B 1/11; G02B 1/14; G02B 2006/1215; G02B 2027/0178; G02B 2027/0194; G02B 21/0056; G02B 21/0068; G02B 21/008; G02B 26/08; G02B 26/103; G02F 1/133553; G02F 1/133514; G02F 2001/133742; G02F 1/133555; G02F 1/13363; G02F 1/133305; G02F 1/133365; G02F 1/13338; G02F 1/133605; G02F 1/133723; G02F 1/134327; G02F 1/1396; G02F 2001/133302; G02F 2001/133557;
(Continued)

(56) References Cited

U.S. PATENT DOCUMENTS

2008/0106187 A1\* 5/2008 Suzuki .................... G09F 13/16
313/503
2010/0207878 A1 8/2010 Nishikawa et al.
(Continued)

FOREIGN PATENT DOCUMENTS

CN 101562193 A 10/2009
CN 103268921 A 8/2013
(Continued)

*Primary Examiner* — Brandi N Thomas
(74) *Attorney, Agent, or Firm* — Birch, Stewart, Kolasch & Birch, LLP

(57) ABSTRACT

A display device serving as a mirror in a non-display state is provided. The display device may include a reflective pattern and a half-mirror layer which are disposed on an upper substrate opposite to a lower substrate. The half-mirror layer may be disposed side by side with the reflective pattern. Thereby, a discontinuous appearance of the reflective image may be reduced, and the degradation of the reflective image due to the diffraction of the light may be prevented or reduced.

9 Claims, 5 Drawing Sheets

(51) Int. Cl.
*G02F 1/29* (2006.01)
*H01L 27/32* (2006.01)
*G02F 1/00* (2006.01)

(58) Field of Classification Search
CPC ..... G02F 2001/13398; G02F 2201/124; G02F 2203/02; G02F 1/0063; G02F 1/1334
USPC ........ 359/237, 242, 265–267, 290–292, 296, 359/298
See application file for complete search history.

(56) References Cited

U.S. PATENT DOCUMENTS

| | | | |
|---|---|---|---|
| 2013/0048838 A1* | 2/2013 | Mori | B82Y 20/00 250/214.1 |
| 2014/0312321 A1 | 10/2014 | Yoo et al. | |
| 2015/0200234 A1 | 7/2015 | Kim | |

FOREIGN PATENT DOCUMENTS

| | | | | |
|---|---|---|---|---|
| CN | 104979375 A | | 10/2015 | |
| CN | 107230687 A | | 10/2017 | |
| KR | 2006-0134316 | * | 12/2006 | ........... G02F 1/1335 |

* cited by examiner

DISPLAY DEVICE HAVING AN EMITTING AREA AND A REFLECTING AREA

This application claims the priority benefit of Korean Patent Application No. 10-2016-0139992, filed on Oct. 26, 2016, which is hereby incorporated by reference in its entirety.

BACKGROUND OF THE INVENTION

Field of the Invention

Embodiments of the present invention relate to a display device having an emitting area for producing an image and a reflecting area for serving as mirror in the non-display state.

Discussion of the Related Art

Generally, an electronic appliance, such as a monitor, a TV, a laptop computer, and a digital camera, include a display device to realize an image. For example, the display device may include a liquid crystal display device and an organic light-emitting display device.

The display device may include emitting areas to realize a specific color in order to display the image. The display device may serve as a mirror in a non-display state in which the image is not displayed. For example, the display device may include a reflecting area in which a material having high-reflectance is disposed. The reflecting area may be disposed between the emitting areas.

However, in the display device, since the reflecting area is discontinuously located due to the emitting areas, the lattice feeling (e.g., a discontinuous appearance or visible patterns) may be felt or perceived when the reflective image reflected from the reflecting area is observed in close proximity. Also, in the high-resolution display device, the quality of the image may be degraded due to the diffraction of the light occurring between the emitting area and the reflecting area.

SUMMARY OF THE INVENTION

Accordingly, the embodiments of the present invention are directed to a display device having an emitting area and a reflecting area that substantially obviates one or more problems due to limitations and disadvantages of the related art.

An objective of the embodiments of the present invention is to provide a display device in which the lattice feeling (e.g., a discontinuous appearance or visible patterns) of the reflective image may be reduced.

Another objective of the embodiments of the present invention is to provide a display device capable of preventing the diffraction of the light between the emitting area and the reflecting area.

Additional advantages, objects, and features of the embodiments of the present invention will be set forth in part in the description which follows and in part will become apparent to those having ordinary skill in the art upon examination of the following or may be learned from practice of the embodiments of the present invention. The objectives and other advantages of the embodiments of the present invention may be realized and attained by the structure particularly pointed out in the written description and claims hereof as well as the appended drawings.

To achieve these objects and other advantages and in accordance with the purpose of the embodiments of the present invention, as embodied and broadly described herein, there is provided a display device including a lower substrate, and a light-emitting structure on the lower substrate. The light-emitting structure includes a lower electrode, a light-emitting layer and an upper electrode, which are sequentially stacked. An upper substrate is disposed on the light-emitting structure. The upper substrate includes an emitting area overlapping with the light-emitting structure and a reflecting area disposed outside the emitting area. A reflective pattern is disposed on a lower surface of the upper substrate facing the lower substrate. The reflective pattern overlaps with the reflecting area of the upper substrate. A half-mirror layer is disposed on the lower surface of the upper substrate. The half-mirror layer overlaps with the emitting area of the upper substrate.

An upper surface of the half-mirror layer in the emitting area of the upper substrate may be coplanar with an upper surface of the reflective pattern in the reflecting area of the upper substrate. The upper surface of the half-mirror layer and the upper surface of the reflective pattern may face the upper substrate.

The half-mirror layer may extend onto a lower surface of the reflective pattern facing the lower substrate.

A mask pattern may be disposed between the lower surface of the reflective pattern and the half-mirror layer.

A half-mirror passivation layer may be disposed on a lower surface of the half-mirror layer. The lower surface of the half-mirror layer may face the lower substrate.

An upper buffer layer may be disposed on the lower surface of the upper substrate. The reflective pattern and the half-mirror layer may be disposed on the lower surface of the upper buffer layer.

A color filter may be disposed between the light-emitting structure and the half-mirror layer.

The color filter may extend onto the lower surface of the reflective pattern.

To accomplish the other object of the present invention, a display device includes a lower substrate and an upper substrate opposite to the lower substrate, and a lower electrode on the lower substrate. A bank insulating layer covering an edge of the lower electrode is disposed on the lower substrate. A light-emitting layer is disposed on a surface of the lower electrode exposed by the bank insulating layer. An upper electrode is disposed on the light-emitting layer. A reflective pattern overlapping with the bank insulating layer is disposed on the upper substrate. A half-mirror layer is disposed on a surface of the upper substrate exposed by the reflective pattern.

The reflective pattern may be in direct contact with the upper substrate. The half-mirror layer may be in direct contact with the upper substrate on the outside of the reflective pattern.

An edge of the half-mirror layer may overlap the reflective pattern.

The edge of the half-mirror layer may be disposed between the upper substrate and the reflective pattern.

The half-mirror layer may include the same material as the reflective pattern.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
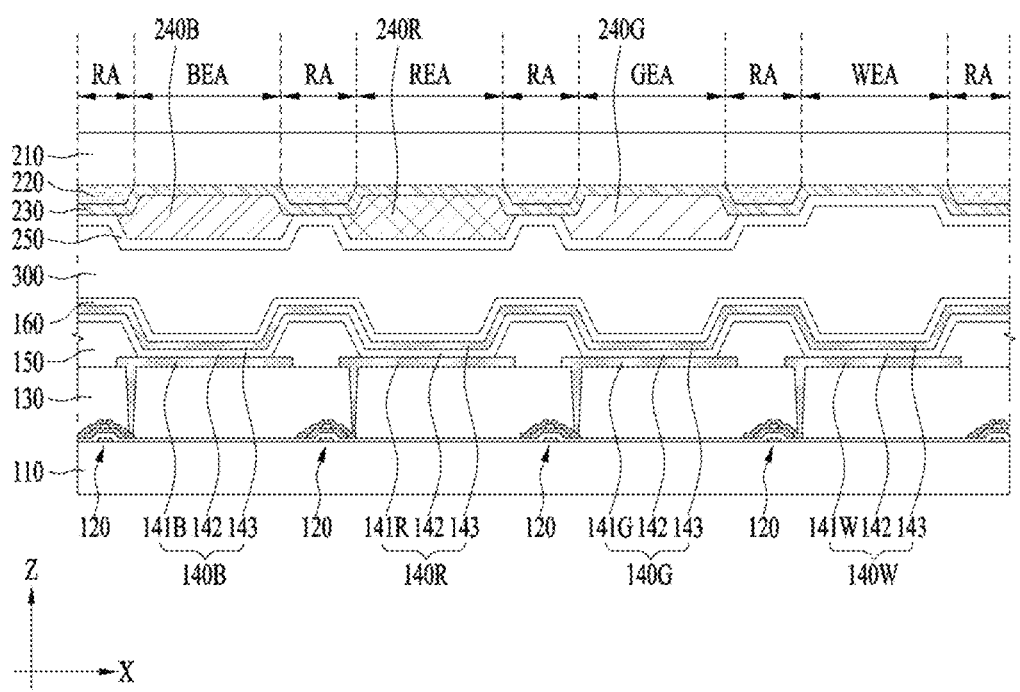
FIG. 1 is a cross-section view schematically showing a display device according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. In this instance, the embodiments of the present invention are provided in order to allow the technical sprit of the present invention to be satisfactorily transferred to (or understood by) those skilled in the art, and thus the present invention may be embodied in other forms and is not limited to the embodiments described below.

In addition, the same or extremely similar elements may be designated by the same reference numerals throughout the specification, and in the drawings, the lengths and thicknesses of layers and regions may be exaggerated for convenience. It will be understood that, when a first element is referred to as being "on" a second element, although the first element may be disposed on the second element so as to come into contact with the second element, a third element may be interposed between the first element and the second element.

In this instance, terms such as, for example, "first" and "second" may be used to distinguish any one element with another element. However, the first element and the second element may be arbitrary named according to the convenience of those skilled in the art without departing the technical sprit of the embodiments of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
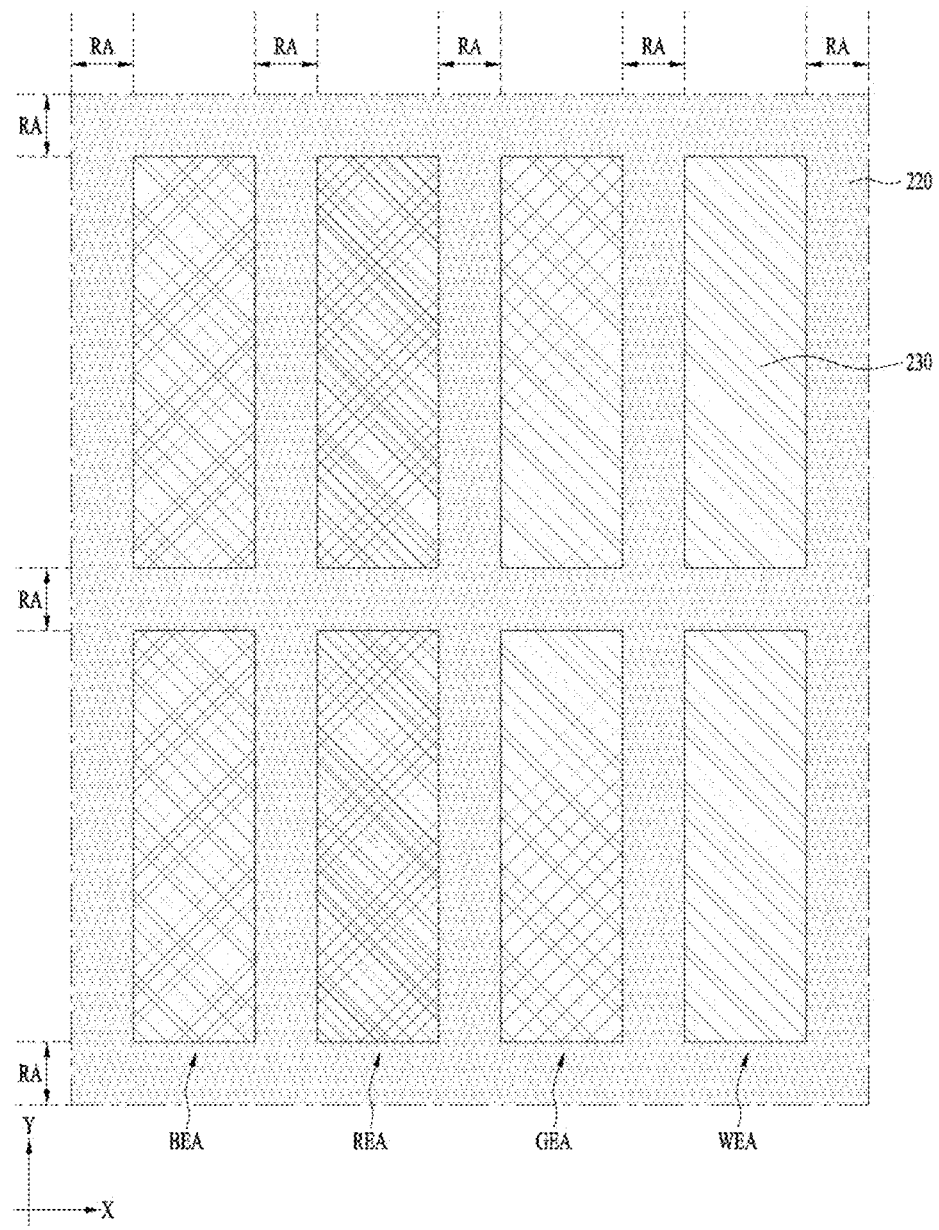
FIG. 2 is a top view schematically showing the display device according to the embodiment of the present invention.

FIG. 1 is a cross-section view schematically showing a display device according to an embodiment of the present invention. FIG. 2 is a top view schematically showing the display device according to the embodiment of the present invention. All the components of the display device according to all embodiments of the present invention are operatively coupled and configured.

Referring to FIGS. 1 and 2, the display device according to the embodiment of the present invention may comprise a lower substrate 110, thin film transistors 120, light-emitting structures 140B, 140R, 140G and 140W, an upper substrate 210, a reflective pattern 220 and a half-mirror layer 230.

The lower substrate 110 may support the thin film transistors 120 and the light-emitting structures 140B, 140R, 140G and 140W. The thin film transistors 120 and the light-emitting structures 140B, 140R, 140G and 140W are repeatedly provided on the lower substrate 110. The lower substrate 110 may include an insulating material. For example, the lower substrate 110 may include glass or plastic.

The lower substrate 110 may include emitting areas BEA, REA, GEA and WEA and one or more reflecting areas RAs. The reflecting area RA may be disposed outside the emitting areas BEA, REA, GEA and WEA. The emitting areas BEA, REA, GEA and WEA may be spaced apart from each other. For example, the reflecting area RA may be disposed between the emitting areas BEA, REA, GEA and WEA. Although FIGS. 1 and 2 only show one set, in embodiments of the present invention, the emitting areas BEA, REA, GEA and WEA and the one or more reflecting areas RAs are repeatedly provided for the lower substrate 110.

The lower substrate 110 may include the emitting areas BEA, REA, GEA and WEA which realize (or provide) a different color light from each other. For example, the lower substrate 110 may include a blue emitting area BEA for realizing blue color (or providing blue color light), a red emitting area REA for realizing red color (or providing red color light), a green emitting area GEA for realizing green color (or providing green color light) and a white emitting area WEA for realizing white color (or providing white color light).

The emitting areas BEA, REA, GEA and WEA may be disposed in a first direction X and a second direction Y perpendicular to the first direction X. For example, the reflecting area RA may be a mesh shape. The emitting areas BEA, REA, GEA and WEA disposed in the first direction X may have a relationship or arrangement different from the emitting areas BEA, REA, GEA and WEA disposed in the second direction Y. For example, the emitting areas BEA, REA, GEA and WEA adjacent in the first direction X may realize a different color from each other, and the emitting areas BEA, REA, GEA and WEA adjacent in the second direction Y may realize or display the same color.

The emitting areas BEA, REA, GEA and WEA may have different lengths in the first direction X and the second direction Y. For example, each of the emitting areas BEA, REA, GEA and WEA may be a rectangular shape. A length of each emitting area BEA, REA, GEA and WEA in the second direction Y may be longer than a length of each emitting area BEA, REA, GEA and WEA in the first direction X.

A distance between the emitting areas BEA, REA, GEA and WEA adjacent in the first direction X may be shorter than the length of each emitting area BEA, REA, GEA and WEA in the first direction X. A length of the reflecting area RA in the first direction X may be smaller than the length of each emitting area BEA, REA, GEA and WEA in the first direction X. A distance between the emitting areas BEA, REA, GEA and WEA adjacent in the second direction Y may be shorter than the length of each emitting area BEA, REA, GEA and WEA in the second direction Y. A length of the reflecting area RA in the second direction Y may be smaller than the length of each emitting area BEA, REA, GEA and WEA in the second direction Y.

The thin film transistors 120 may be disposed on the lower substrate 110. For example, the thin film transistors 120 may be in direct contact with an upper surface of the lower substrate 110 facing the upper substrate 210. For example, each of the thin film transistors 120 may include a gate electrode contacting with the lower substrate 110, a gate insulating layer on the gate electrode, a semiconductor pattern on the gate insulating layer, a source electrode connected to a portion of the semiconductor pattern, and a drain electrode connected to another portion of the semiconductor pattern. Each of the thin film transistors 120 may further include an etch stopper covering the semiconductor pattern between the source electrode and the drain electrode.

The display device according to the embodiment of the present invention is described that the thin film transistors 120 are in direct contact with the lower substrate 110. However, the display device according to another embodiment of the present invention may further comprise a lower buffer layer between the lower substrate 110 and the thin film transistors 120. The lower buffer layer may include an insulating material. For example, the lower buffer layer may be silicon oxide.

The display device according to the embodiment of the present invention is described that each of the thin film transistors 120 includes a gate electrode between the lower substrate 110 and the semiconductor pattern. However, in the display device according to another embodiment of the present invention, the semiconductor pattern of each thin film transistor 120 may be disposed between the lower substrate 110 and the gate electrode.

The display device according to the embodiment of the present invention may further comprise a planarization layer 130 in order to remove a different thickness due to the thin film transistors 120. For example, an upper surface of the planarization layer 130 facing the upper substrate 210 may be a flat surface. The upper surface of the planarization layer 130 may be parallel with the upper surface of the lower substrate 110. The thin film transistors 120 may be completely covered by the planarization layer 130. The planarization layer 130 may include an insulating material. For example, the planarization layer 130 may include silicon oxide.

The display device according to the embodiment of the present invention is described that the thin film transistors 120 is in direct contact with the planarization layer 130. However, the display device according to another embodiment of the present invention may further comprise a lower passivation layer between the thin film transistors 120 and the planarization layer 130. The lower passivation layer may include an insulating material. The lower passivation layer may include a material different from the planarization layer 130. For example, the lower passivation layer may include silicon nitride.

The light-emitting structures 140B, 140R, 140G and 140W may realize a specific color, respectively. For example, each of the light-emitting structures 140B, 140R, 140G and 140W may include a lower electrode 141B, 141R, 141G and 141W, a light-emitting layer 142, and an upper electrode 143, which are sequentially stacked.

The light-emitting structures 140B, 140R, 140G and 140W may be disposed at the emitting areas BEA, REA, GEA and WEA of the lower substrate 110, respectively. For example, the light-emitting structures 140B, 140R, 140G and 140W may include a blue light-emitting structure 140B at the blue emitting area BEA of the lower substrate 110, a red light-emitting structure 140R at the red emitting area REA of the lower substrate 110, a green light-emitting structure 140G at the green emitting area GEA of the lower substrate 110, and a white light-emitting structure 140W at the white emitting area WEA of the lower substrate 110.

The light-emitting structures 140B, 140R, 140G and 140W may selectively generate the light by the thin film transistors 120. For example, the lower electrode 141B, 141R, 141G and 141W of each light-emitting structure 140B, 140R, 140G and 140W may be electrically connected to the thin film transistor 120 related to the corresponding emitting area BEA, REA, GEA and WEA. The light-emitting structures 140B, 140R, 140G and 140W may be disposed on the planarization layer 130. For example, the planarization layer 130 may include contact holes exposing a portion of each thin film transistor 120.

The lower electrode 141B, 141R, 141G and 141W may include a material having high-reflectance. For example, the lower electrode 141B, 141R, 141G and 141W may include a metal, such as at least one of aluminum (Al) and silver (Ag). The lower electrode 141B, 141R, 141G and 141W may have a multi-layer structure. For example, the lower electrode 141B, 141R, 141G and 141W may have a structure in which a reflective electrode including a material having high-reflectance is positioned between transparent electrodes including a transparent conductive material such as at least one of indium tin oxide (ITO) and indium zinc oxide (IZO).

The lower electrode 141B, 141R, 141G and 141W of each light-emitting structure 140B, 140R, 140G and 140W may be electrically insulated from the lower electrode 141B, 141R, 141G and 141W of the adjacent light-emitting structure 140B, 140R, 140G and 140W. For example, the lower electrodes 141B, 141R, 141G and 141W may be spaced apart from each other.

The display device according to the embodiment of the present invention may further include a bank insulating layer 150 between the adjacent lower electrodes 141B, 141R, 141G and 141W. The bank insulating layer 150 may fill a space between the adjacent lower electrodes 141B, 141R, 141G and 141W. For example, the bank insulating layer 150 may overlap with the reflecting area RA of the lower substrate 110. The bank insulating layer 150 may cover an edge of each lower light-emitting electrode 141B, 141R, 141G and 141W. The bank insulating layer 150 may include an insulating material. For example, the bank insulating layer 150 may include an organic insulating material, such as at least one of benzocyclobutene (BCB), poly-imide and photo-acryl.

The light-emitting layer 142 may be disposed on a portion of the lower light-emitting electrode 141B, 141R, 141G and 141W of the corresponding light-emitting structure 140B, 140R, 140G and 140W exposed by the bank insulating layer 150. For example, the light-emitting layer 142 may be disposed on a surface of the lower light-emitting electrode 141B, 141R, 141G and 141W which is disposed at the corresponding emitting area BEA, REA, GEA and WEA of the lower substrate 110.

The light-emitting layer 142 may generate light having luminance corresponding to a voltage difference between the lower electrode 141B, 141R, 141G and 141W and the upper electrode 143 of the corresponding light-emitting structure 140B, 140R, 140G and 140W. For example, the light-emitting layer 142 may include an emitting material layer (EML) having an emission material. The emission material may include an organic material, an inorganic material or a hybrid material. For example, the display device according to the embodiment of the present invention may be an organic light-emitting display device having an organic light-emitting layer.

The light-emitting layer 142 may have a multi-layer structure in order to increase luminous efficacy. For example, the light-emitting layer 142 may further include at least one of a hole injection layer (HIL), a hole transporting layer (HTL), an electron transporting layer (ETL), and an electron injection layer (EIL).

The upper electrode 143 may be disposed on the light-emitting layer 142. In embodiments of the present invention, the upper electrode 143 may include a conductive material. In embodiments of the present invention, the upper electrode 143 may include a transparent material. In embodiments of the present invention, the upper electrode 143 may include a transparent conductive material. The upper electrode 143 may include a material different from the lower electrode 141B, 141R, 141G and 141W. For example, the lower electrode 141B, 141R, 141G and 141W may be an anode, and the upper electrode 143 may be a cathode.

The upper substrate 210 may be opposite to the lower substrate 110. For example, the upper substrate 210 may be disposed on the light-emitting structures 140B, 140R, 140G and 140W. In embodiments of the present invention, the upper substrate 210 may include an insulating material. In embodiments of the present invention, the upper substrate 210 may include a transparent material. In embodiments of the present invention, the upper substrate 210 may include a transparent insulating material. For example, the upper substrate 210 may include glass or plastic.

The upper substrate 210 may include emitting areas BEA, REA, GEA and WEA and one or more reflecting areas RA. In embodiments of the present invention, the emitting areas BEA, REA, GEA and WEA and the one or more reflecting areas RAs are repeatedly provided for the upper substrate 210. The emitting areas BEA, REA, GEA and WEA of the upper substrate 210 may overlap with the emitting areas BEA, REA, GEA and WEA of the lower substrate 110, respectively. For example, the upper substrate 210 may include a blue emitting area BEA overlapping with the blue light-emitting structure 140B, a red emitting area REA overlapping with the red light-emitting structure 140R, a green emitting area GEA overlapping with the green light-emitting structure 140B, and a white emitting area WEA overlapping with the white light-emitting structure 140W. The reflecting area RA of the upper substrate 210 may overlap with the reflecting area RA of the lower substrate 110. For example, the emitting areas BEA, REA, GEA and WEA of the upper substrate 210 may be surrounded by the reflecting area RA of the upper substrate 210, respectively.

The reflective pattern 220 may be disposed on the reflecting area RA of the upper substrate 210. The reflective pattern 220 may overlap the reflecting area RA of the lower substrate 110. For example, the reflective pattern 220 may overlap with the bank insulating layer 150. The reflecting area RA of the upper substrate 210 may be covered by the reflective pattern 220. For example, the reflective pattern 220 may be a mesh shape. The reflective pattern 220 may be disposed between the lower substrate 110 and the upper substrate 210. For example, the reflective pattern 220 may be disposed on a lower surface of the upper substrate 210 facing the lower substrate 110.

The reflective pattern 220 may reflect the incident light. The reflective pattern 220 may include a material having high-reflectance. The reflective pattern 220 may include the same material as the reflective electrode of the lower electrode 141B, 141R, 141G and 141W. For example, the reflective pattern 220 may include a metal, such as at least one of aluminum (Al) and silver (Ag).

The half-mirror layer 230 may be disposed on the emitting areas BEA, REA, GEA and WEA of the upper substrate 210. The lower surface of the upper substrate 210 exposed by the reflective pattern 220 may be covered by the half-mirror layer 230. In embodiments of the present invention, portions of the reflective pattern 220 may contact portions of the upper substrate 210, respectively.

The half-mirror layer 230 may partially reflect an externally incident light. For example, only about half of the external light incident on the half-mirror layer 230 may be transmitted through. In embodiments of the present invention, the amount of external light that may be transmitted may be more than half or less than half. The half-mirror layer 230 may include a reflective material. A thickness of the half-mirror layer 230 may be smaller than a thickness of the reflective pattern 220. The half-mirror layer 230 may include the same material as the reflective pattern 220. For example, the half-mirror layer 230 may include a metal, such as at least one of aluminum (Al) and silver (Ag).

The display device according to the embodiment of the present invention may include the half-mirror layer 230 which covers the surface of the upper substrate 210 exposed by the reflective pattern 220. Thus, in the display device according to the embodiment of the present invention, the externally incident light may be reflected not only at the reflecting area RA of the upper substrate 210 but also at the emitting areas BEA, REA, GEA and WEA of the upper substrate 210 in the non-display state in which the image is not displayed. Therefore, in the display device according to the embodiment of the present invention, the lattice feeling (e.g., a discontinuous appearance or visible patterns) of the reflective image in the non-display state may be largely reduced.

Also, the display device according to the embodiment of the present invention may include the upper substrate 210 in which the reflective pattern 220 and the half-mirror layer 230 may be disposed side by side. Thus, in the display device according to the embodiment of the present invention, the diffraction of the light between the adjacent reflecting areas RA of the upper substrate 210 may be prevented or reduced. Therefore, in the display device according to the embodiment of the present invention, the degradation of the image due to the diffraction of the light may be prevented or reduced.

An upper surface of the half-mirror layer 230 facing the upper substrate 210 in the emitting areas BEA, REA, GEA and WEA of the upper substrate 210 may be coplanar with an upper surface of the reflective pattern 220 facing the upper substrate 210 in the reflecting area RA of the upper substrate 210. That is, in the display device according to the embodiment of the present invention, the upper surface of the reflective pattern 220 may be continuous with the upper surface of the half-mirror layer 230 in the emitting areas BEA, REA, GEA and WEA of the upper substrate 210. For example, in the display device according to the embodiment of the present invention, the portions of the reflective pattern 220 may be in direct contact with the reflecting area RA of the upper substrate 210, and the half-mirror layer 230 may be in direct contact with the emitting areas BEA, REA, GEA and WEA of the upper substrate 210. Thus, in the display device according to the embodiment of the present invention, the reflective image due to the reflective pattern 220 and the reflective image due to the half-mirror layer 230 may have the same focus or reflectivity in the non-display state. Therefore, in the display device according to the embodiment of the present invention, the lattice feeling of the reflective image in the non-display state may be further reduced.

The half-mirror layer 230 or portions thereof may extend onto a lower surface of the reflective pattern 220 facing the lower substrate 110. That is, a method of forming the display device according to the embodiment of the present invention may include a step of forming the reflective pattern 220 on the reflecting area RA of the upper substrate 210, and a step of forming the half-mirror layer 230 on the entire surface of the upper substrate 210 in which the reflective pattern 220 is formed. In embodiments of the present invention, the reflective pattern 220 may be accommodated by the half-mirror layer 230. Thus, in the display device according to the embodiment of the present invention, the production process of the upper substrate 210 including the reflective pattern 220 and the half-mirror layer 230 may be simplified. Therefore, in the display device according to the embodiment of the present invention, the lattice feeling of the reflective image may be reduced, and the degradation of the image due to the diffraction of the light may be prevented or reduced without a major change in the production efficiency.

In the display device according to the embodiment of the present invention, the light-emitting structures 140B, 140R, 140G and 140W may realize the same color. For example, each of the light-emitting structures 140B, 140R, 140G and 140W may include the light-emitting layer 142 formed of the same material. For example, the light-emitting layer 142 of each light-emitting structure 140B, 140R, 140G and 140W may be connected to each other. The light-emitting layers 142 of the light-emitting structures 140B, 140R, 140G and 140W may be extended onto the bank insulating layer 150. For example, the light-emitting layer 142 may realize or emit white color. The upper electrode 143 of each light-emitting structure 140B, 140R, 140G and 140W may extend along the light-emitting layer 142. For example, the upper electrodes 143 of the light-emitting structures 140B, 140R, 140G and 140W may be connected to each other.

The display device according to the embodiment of the present invention may further comprise color filters 240B, 240R and 240G in order to realize corresponding color in the emitting areas BEA, REA, GEA and WEA. The color filters 240B, 240R and 240G may be not disposed at the emitting area BEA, REA, GEA and WEA realizing the same color as the light-emitting layer 142 of the light-emitting structures 140B, 140R, 140G and 140W. For example, the color filters 240B, 240R and 240G may include a blue color filter 240B for realizing blue color, a red color filter 240R for realizing red color, and a green color filter 240G for realizing green color.

The color filters 240B, 240R and 240G may be disposed between the light-emitting structures 140B, 140R, 140G and 140W and the half-mirror layer 230. For example, the color filters 240B, 240R and 240G may be disposed close to the half-mirror layer 230. An edge of each color filter 240B, 240R and 240G may extend onto the lower surface of the reflective pattern 220. Thus, in the display device according to the embodiment of the present invention, a black matrix for preventing or reducing color mixing due to color filters may be not formed.

In the display device according to the embodiment of the present invention, the upper substrate 210 in which the reflective pattern 220 and the half-mirror layer 230 may be attached to the lower substrate 110 in which the light-emitting structures 140B, 140R, 140G and 140W are formed by an adhesive layer 300. Thus, the display device according to the embodiment of the present invention may further include a device passivation layer 160 on the light-emitting structures 140B, 140R, 140G and 140W, and an upper passivation layer 250 on the color filters 240B, 240R and 240G.

Accordingly, the display device according to the embodiment of the present invention may include the half-mirror layer 230 which covers a region of the upper substrate 210 overlapping with the light-emitting structures 140B, 140R, 140G and 140W, and the reflective pattern 220 which covers a region of the upper substrate 210 overlapping with the bank insulating layer 150, so that the lattice feeling of the reflective image may be reduced and the degradation of the image due to the diffraction of the light may be prevented or reduced. In the display device according to the embodiment of the present invention, since the light emitted from each emitting area BEA, REA, GEA and WEA passes through the half-mirror layer 230, the luminance per unit area of each emitting area BEA, REA, GEA and WEA may be lowered. However, in the display device according to the embodiment of the present invention, the entire region of the upper substrate 210 may serve as a mirror in the non-display state. In addition, the display device according to the embodiment of the present invention may maximize the emitting area BEA, REA, GEA and WEA of the upper substrate 210 by limiting the reflective area RA of the upper substrate 210 to only a region overlapping with the bank insulating layer 150, as shown in FIG. 2. Thereby, in the display device according to the embodiment of the present invention, the overall luminous efficacy may be increased.

In an embodiment of the present invention, the half-mirror layer 230 may have a recessed portion relative to a lower surface of the upper substrate 210. The recessed portion of the half-mirror layer 230 overlaps the reflecting area RA. In an embodiment of the present invention, the reflective pattern 220 may be accommodated in the recessed portion of the half-mirror layer 230. In an embodiment of the present invention, the half-mirror layer 230 may have a non-recessed portion relative to a lower surface of the upper substrate 210. The non-recessed portion of the half-mirror layer 230 overlaps the emitting area (e.g., BEA). In an embodiment of the present invention, the non-recessed portion of the half-mirror layer 230 may directly contact the upper substrate 210. In an embodiment of the present invention, the non-recessed portion of the half-mirror layer 230 may be rectangular in shape (e.g., see FIG. 2). In an embodiment of the present invention, a color filter (e.g., 240B) may be disposed in the non-recessed portion of the half-mirror layer 230. In an embodiment of the present invention, the recessed portion of the half-mirror layer 230 may surround the non-recessed portion of the half-mirror layer 230 (e.g., see FIG. 2). In an embodiment of the present invention, the recessed portion of the half-mirror layer 230 and the reflective pattern 220 may be coplanar on the upper substrate 210.

Figure 3:
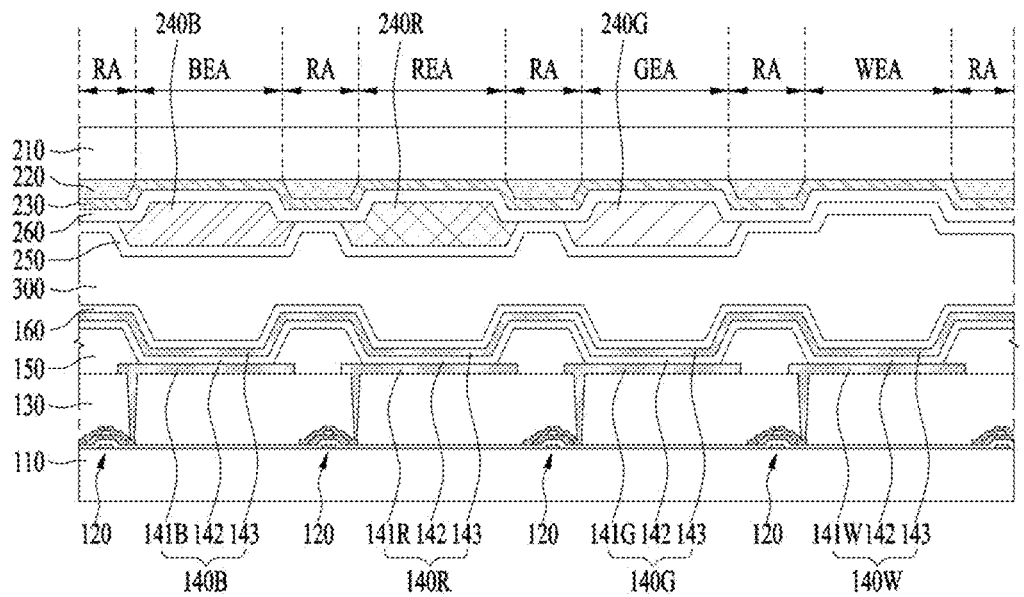
FIGS. 3 to 8 are respectively various examples of a display device according to other embodiments of the present invention.

The display device according to the embodiment of the present invention is described with the half-mirror layer 230 being in direct contact with the color filters 240B, 240R and 240G. However, in the display device according to another embodiment of the present invention, a half-mirror passivation layer 260 may be disposed on the lower surface of the half-mirror layer 230, and the color filters 240B, 240R and 240G may be disposed on the half-mirror passivation layer 260, as shown in FIG. 3. The half-mirror passivation layer 260 may include a material capable of preventing or reducing oxidation of the reflective pattern 220 and the half-mirror layer 230. For example, the half-mirror passivation layer 260 may be silicon oxide and/or silicon nitride. The half-mirror passivation layer 260 may have a multi-layer structure. Thus, in the display device according to another embodiment of the present invention, the property degradation due to the oxidation of the reflective pattern 220 and the half-mirror layer 230 may be prevented or reduced.

Figure 4:
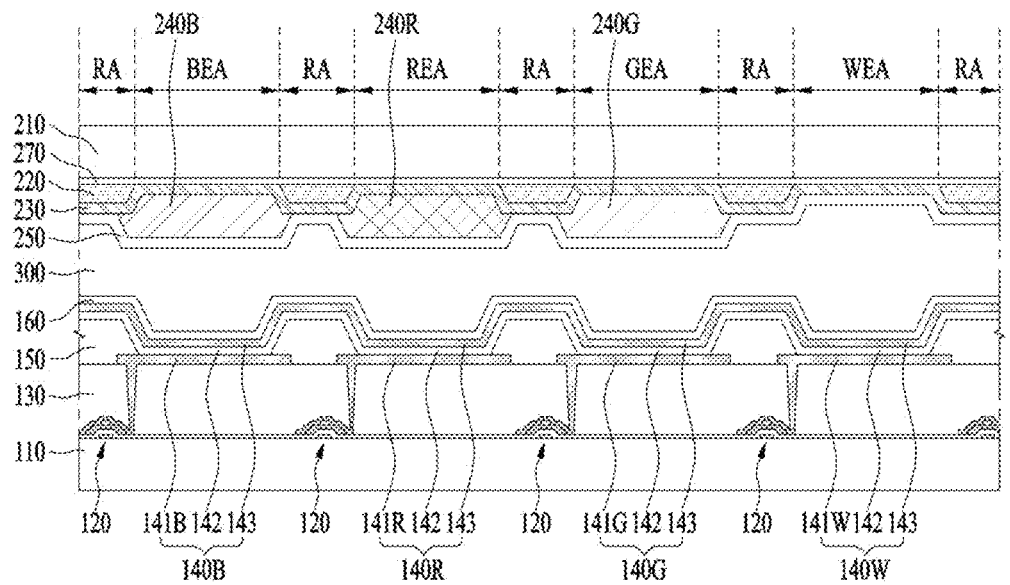

The display device according to the embodiment of the present invention is described with the reflective pattern 220 and the half-mirror layer 230 being in direct contact with the upper substrate 210. However, the display device according to another embodiment of the present invention may further comprise an upper buffer layer 270 contacting with the lower surface of the upper substrate 210, as shown in FIG. 4. The reflective pattern 220 and the half-mirror layer 230 may be disposed on the upper buffer layer 270. The upper buffer layer 270 may include a material capable of enhancing the adhesion between the reflective pattern 220 and the upper substrate 210, and between the half-mirror layer 230 and the upper substrate 210. For example, the upper buffer layer 270 may include ITO or IZO. Thus, in the display device according to another embodiment of the present invention, the mirror function by the reflective pattern 220 and the half-mirror layer 230 may be stably performed.

Figure 5:
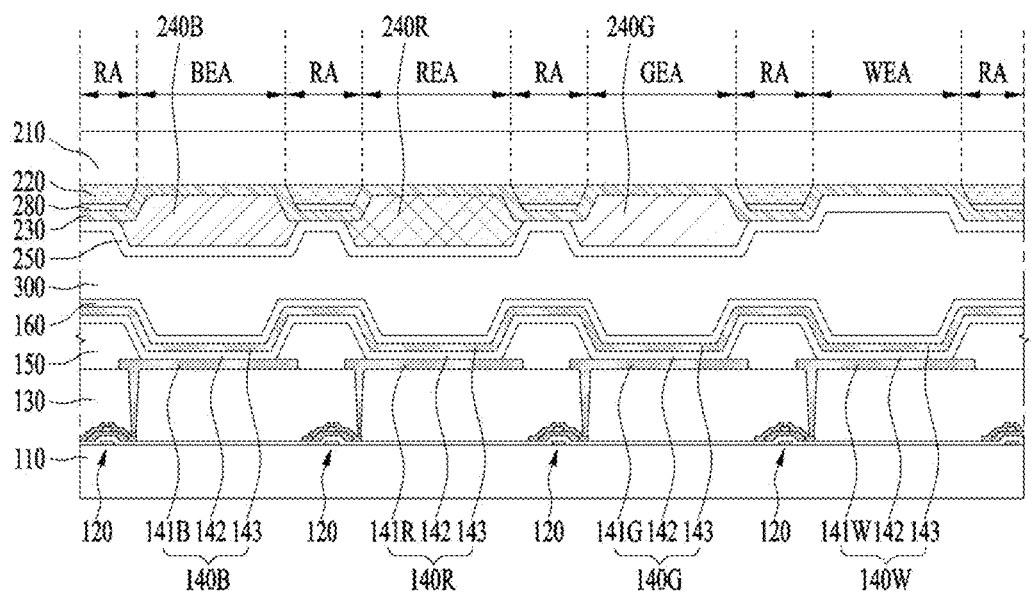

The display device according to the embodiment of the present invention is described with the lower surface of the reflective pattern 220 being in direct contact with the half-mirror layer 230. However, the display device according to another embodiment of the present invention may further comprise a mask pattern 280 between the lower surface of the reflective pattern 220 and the half-mirror layer 230 as shown in FIG. 5. That is, a method of forming the display device according to another embodiment of the present invention may include a step of forming the reflective pattern 220 using the mask pattern 280, and a step of forming the half-mirror layer 230 on the upper substrate 210 in which the mask pattern 280 is not removed. Thus, in the display device according to another embodiment of the present invention, the production efficiency may be further improved.

Figure 6:
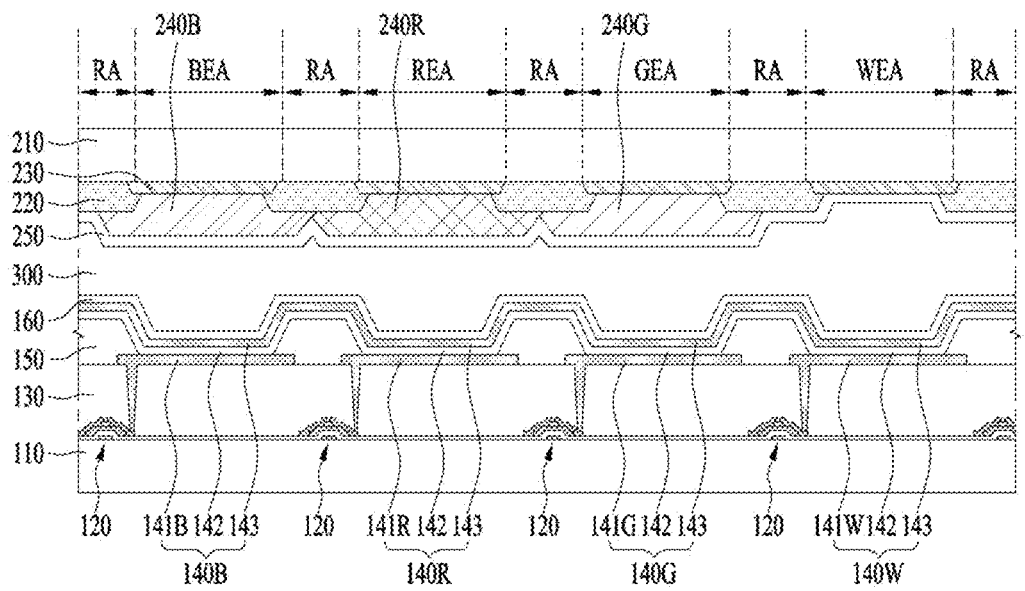

The display device according to the embodiment of the present invention is described with the half-mirror layer 230 extending onto the lower surface of the reflective pattern 220. However, in the display device according to another embodiment of the present invention, an edge of the half-mirror layer 230 may overlap with an edge of the reflective pattern 220. For example, in the display device according to another embodiment of the present invention, the edge of the half-mirror layer 230 may be disposed between the upper substrate 210 and the reflective pattern 220, as shown in FIG. 6. That is, a method of forming the display device according to another embodiment of the present invention may include a step of forming the half-mirror layer 230 on the upper substrate 210, and a step of forming the reflective pattern 220 on the half-mirror layer 230.

Figure 7:
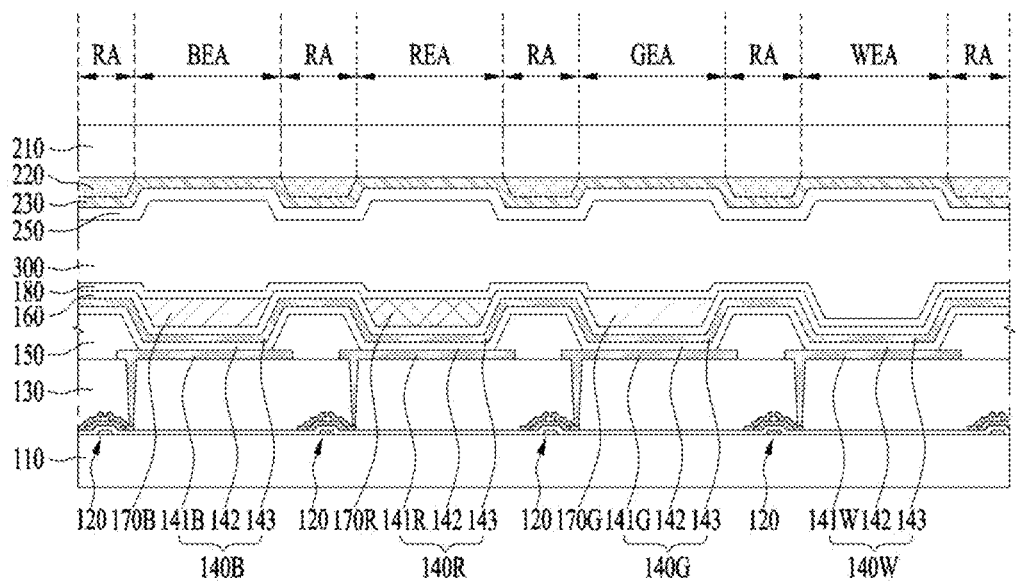

The display device according to the embodiment of the present invention is described with the color filters 240B, 240R and 240G being disposed on the upper substrate 210 in which the half-mirror layer 230 is formed. However, the display device according to another embodiment of the present invention may include the color filters 170B, 170R and 170G close to the light-emitting structures 140B, 140R, 140G and 140W, as shown in FIG. 7. The display device according to another embodiment of the present invention may further comprise an intermediate passivation layer 180 on the color filters 170B, 170R and 170G. The intermediate passivation layer 180 may prevent or reduce the damage of the light-emitting structure 140B, 140R, 140G and 140W from a step of forming the color filters 170B, 170R and 170G.

Figure 8:
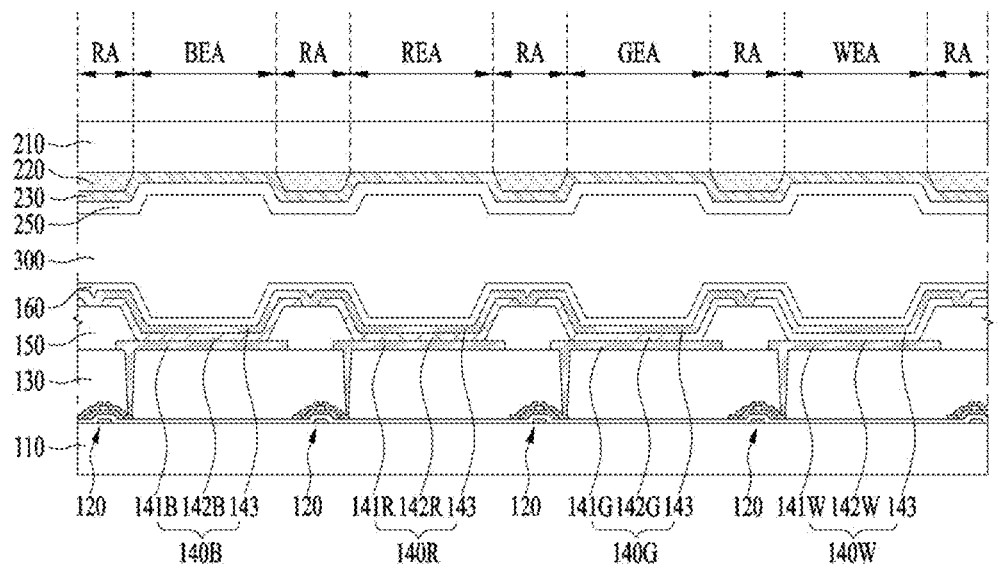

The display device according to the embodiment of the present invention is described with the light-emitting structures 140B, 140R, 140G and 140W realizing or providing the same color. However, in the display device according to another embodiment of the present invention, each of the light-emitting structure 140B, 140R, 140G and 140W at the corresponding emitting area BEA, REA, GEA and WEA may include a light-emitting layer 142B, 142R, 142G and 142W separated from the adjacent light-emitting structure 140B, 140R, 140G and 140W, as shown in FIG. 8. For example, in the display device according to another embodiment of the present invention, the blue light-emitting structure 140B may include a blue light-emitting layer 142B, the red light-emitting structure 140R may include a red light-emitting layer 142R, the green light-emitting structure 140G may include a green light-emitting layer 142G, and a white light-emitting structure 140W may include a white light-emitting layer 142W. The light-emitting layers 142B, 142R, 142G and 142W may be separated on the bank insulating layer 150. Thus, in the display device according to another embodiment of the present invention, the color filter may be not used.

The display device according to the embodiments of the present invention may reduce the lattice feeling (e.g., a discontinuous appearance or visible patterns) of the reflective image. Also, in the display device according to the embodiments of the present invention, the degradation of the image due to the diffraction of the light may be prevented or reduced. Thereby, in the display device according to the embodiments of the present invention, the quality of the image may be increased.

What is claimed is:

1. A display device comprising:
   a lower substrate;
   light-emitting structures on the lower substrate, each of the light-emitting structures including a lower electrode, a light-emitting layer and an upper electrode, which are sequentially stacked;
   an upper substrate on the light-emitting structures, the upper substrate including emitting areas overlapping with the light-emitting structures and reflecting areas disposed outside the emitting areas;
   reflective patterns on a lower surface of the upper substrate facing the lower substrate, the reflective patterns overlapping with the reflecting areas of the upper substrate; and
   a half-mirror layer on the lower surface of the upper substrate, the half-mirror layer overlapping with the emitting areas of the upper substrate,
   wherein the half-mirror layer is disposed between the reflective patterns on the emitting areas, and
   wherein an upper surface of the half-mirror layer facing the lower surface of the upper substrate in the emitting areas of the upper substrate is coplanar with an upper surface of the reflective patterns facing the lower surface of the upper substrate in the reflecting areas of the upper substrate.

2. The display device according to claim 1, wherein the half-mirror layer extends onto a lower surface of the reflective patterns facing the lower substrate.

3. The display device according to claim 2, further comprising mask patterns disposed between the lower surface of each reflective pattern and the half-mirror layer.

4. The display device according to claim 2, further comprising a half-mirror passivation layer on a lower surface of the half-mirror layer facing the lower substrate.

5. The display device according to claim 1, further comprising an upper buffer layer between the upper substrate and the reflective patterns, and
wherein the upper buffer layer extends between the upper substrate and the half-mirror layer.

6. The display device according to claim 1, further comprising color filters between the light-emitting structures and the half-mirror layer.

7. The display device according to claim 6, wherein each of the color filters extends onto a lower surface of the reflective patterns facing the lower substrate.

8. The display device according to claim 6, wherein the half-mirror layer is interposed between the color filters and the lower surface of the upper substrate.

9. The display device according to claim 1, wherein the half-mirror layer contacts the reflective patterns.

* * * * *